United States Patent
Lee et al.

(10) Patent No.: US 8,303,862 B2
(45) Date of Patent: Nov. 6, 2012

(54) PHOTOSENSITIVE RESIN COMPOSITION FOR COLOR FILTER AND COLOR FILTER USING SAME

(75) Inventors: Chang-Min Lee, Uiwang-si (KR);
Kil-Sung Lee, Uiwang-si (KR);
Jae-Hyun Kim, Uiwang-si (KR);
Jun-Seok Kim, Uiwang-si (KR);
Sang-Won Cho, Uiwang-si (KR);
Gyu-Seok Han, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/238,424

(22) Filed: Sep. 21, 2011

(65) Prior Publication Data

US 2012/0112141 A1    May 10, 2012

(30) Foreign Application Priority Data

Nov. 8, 2010    (KR) ........................ 10-2010-0110578

(51) Int. Cl.
*G02B 5/23*   (2006.01)
*C08F 2/50*   (2006.01)
*C08F 2/46*   (2006.01)
*C08J 3/28*   (2006.01)
*G03F 7/033*  (2006.01)
*G03F 7/032*  (2006.01)

(52) U.S. Cl. ............ 252/586; 430/270.1; 430/281.1; 430/286.1; 430/287.1; 430/293; 522/71; 522/74; 522/79; 522/80; 522/81; 522/101; 522/103; 522/104; 522/113; 522/120; 522/123; 522/149; 522/153; 522/154; 522/178; 522/182; 522/183

(58) Field of Classification Search ............ 252/586; 430/7, 270.1, 281.1, 286.1, 287.1, 293; 522/33, 522/42, 46, 53, 63, 78, 79, 182, 71, 74, 80, 522/81, 101, 103, 104, 113, 120, 123, 149, 522/153, 154, 178, 183
See application file for complete search history.

(56) References Cited

U.S. PATENT DOCUMENTS

| | | | |
|---|---|---|---|
| 5,998,091 A | 12/1999 | Suzuki | |
| 2005/0112501 A1 * | 5/2005 | Ikegami et al. | ............ 430/281.1 |
| 2010/0160474 A1 | 6/2010 | Lee et al. | |
| 2010/0216073 A1 | 8/2010 | Kim et al. | |

FOREIGN PATENT DOCUMENTS

| | | |
|---|---|---|
| EP | 0725315 B1 | 5/2001 |
| JP | 03-050271 | 3/1991 |
| JP | 07-140654 | 6/1995 |
| JP | 10-254133 | 9/1998 |
| JP | 2003-149810 * | 5/2003 |
| KR | 10-1992-7002502 | 9/1992 |
| KR | 10-1993-7000858 | 3/1993 |
| KR | 10-1994-0005617 | 6/1994 |
| KR | 10-1995-7000359 | 1/1995 |
| KR | 10-1995-0011163 | 9/1995 |
| KR | 10-1995-7003746 | 9/1995 |
| KR | 10-1996-0029904 | 8/1996 |
| KR | 10-2002-0066504 A | 8/2002 |
| KR | 10-2009-0024561 A | 3/2009 |
| KR | 10-2009-0066600 A | 6/2009 |

OTHER PUBLICATIONS

Office Action in commonly owned U.S. Appl. No. 13/195,094 mailed Jan. 25, 2012, pp. 1-12.

* cited by examiner

*Primary Examiner* — Bijan Ahvazi
(74) *Attorney, Agent, or Firm* — Summa, Additon & Ashe, P.A.

(57) ABSTRACT

Disclosed are a photosensitive resin composition for a color filter and a color filter including the same. The photosensitive resin composition for a color filter may include (A) an acrylic-based copolymer including a structural unit represented by the following Chemical Formula 1 and a structural unit represented by the following Chemical Formula 2, wherein the substituents of Chemical Formula 1 and Chemical Formula 2 are the same as defined in the specification; (B) an acrylic-based photopolymerizable monomer; (C) a photopolymerization initiator; (D) a pigment; and (E) a solvent.

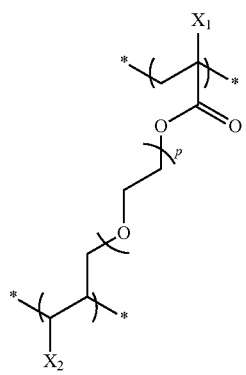

[Chemical Formula 1]

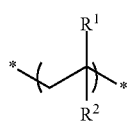

[Chemical Formula 2]

10 Claims, No Drawings

PHOTOSENSITIVE RESIN COMPOSITION FOR COLOR FILTER AND COLOR FILTER USING SAME

CROSS-REFERENCE TO RELATED APPLICATION

This application claims priority under 35 USC Section 119 to and the benefit of Korean Patent Application No. 10-2010-0110578 filed in the Korean Intellectual Property Office on Nov. 8, 2010, the entire disclosure of which is incorporated herein by reference.

FIELD OF THE INVENTION

The present invention relates to a photosensitive resin composition for a color filter and a color filter using the same.

BACKGROUND OF THE INVENTION

Color filters are used in liquid crystal displays (LCDs), optical filters for cameras, and the like. The color filters may be fabricated by coating a fine region with three or more colors on a charge-coupled device or a transparent substrate. The colored thin film can be fabricated by dyeing, printing, electrophoretic deposition (EPD), pigment dispersion, inkjet printing, and the like.

The dyeing method forms a colored film by forming an image having a dyeing agent on a substrate and then dyeing the image with a direct dye and the like. Examples of the dyeing agent used in fabricating a colored thin film include natural photosensitive resins such as gelatin and the like, amine-modified polyvinyl alcohols, amine-modified acrylic-based resins, and the like. However, the dyeing process may be complex and lengthy, since it should include resist-printing whenever a color needs to be changed to form a multicolored thin film on the same substrate.

In addition, many generally-used dyes and resins may have good color vividness and dispersion but also poor color fastness, water resistance, and heat resistance, which are very important characteristics. For example, azo and azide compounds have been used as a dye but have deteriorated heat resistance and durability compared with a pigment.

The printing method forms a colored thin film by printing an ink prepared by dispersing a pigment into a thermally curable or photocurable resin and curing it with heat or light. This method may decrease a material cost compared with other methods, but it is difficult to form a fine and precise image and to acquire a uniform thin film layer.

Korean Patent Laid-Open Publication No. 1995-7003746 discloses a method of making a color filter using an inkjet method. However, the resultant color filter suffers similar problems to a color filter made using the dyeing method, for example, deteriorated durability and heat resistance, because this inkjet printing method is performed by also using a dye-type color resist composition and dispersing it from a nozzle to accomplish fine and precise color printing.

Korean Patent Laid-Open Publication Nos. 1993-7000858 and 1996-0029904 disclose an electrophoretic deposition (EPD) method using an electric precipitation method. The electrophoretic deposition (EPD) can form a precise color film having excellent heat resistance and color fastness, since it uses a pigment. However, this method may not be useful in the production of a highly precise color filter requiring a finer electrode pattern for a more precise pixel in the future, because it may produce a colored film that is stained or thicker at both ends due to electrical resistance.

The pigment dispersion method forms a colored film by repeating a series of processes such as coating, exposing to a light, developing, and curing a photopolymer composition including a coloring agent on a transparent substrate including a black matrix.

The pigment dispersion method can improve heat resistance and durability, which are very important characteristics for a color filter, and can provide a film with a uniform thickness. For example, Korean Patent Laid-Open Publications Nos. 1992-7002502, 1994-0005617, 1995-7000359, 1994-0005617, and 1995-0011163 disclose a method of preparing a photosensitive resin composition for a color filter using a pigment dispersion method.

In this pigment dispersion method, a photosensitive resin composition for a color filter generally includes a binder resin, a photopolymerization monomer, a photopolymerization initiator, an epoxy resin, a solvent, and other additives. For example, the binder resin may include a carboxyl-containing acrylic-based copolymer in Japanese Patent Laid-Open Publications Pyung 7-140654 and 10-254133.

The color filter can be subjected to many chemical treatments during the manufacturing process. Accordingly, a color photosensitive resin should have a development margin and chemical resistance sufficient to improve yields of a color filter and to maintain a pattern formed under the aforementioned conditions.

Conventional color liquid crystal displays (LCDs) are generally fabricated by preparing a color filter substrate for displaying a color image separately from an operating substrate on which a thin film transistor (TFT) array is disposed and then binding the color filter substrate and the operating substrate together. However, since there can be low arrangement accuracy during the binding step, conventional color liquid crystal displays can require a shading layer with a large width. Accordingly, it is difficult to increase the aperture ratio (a ratio of an active light-emitting area to a total pixel area). In addition, because the glass substrate and LCD screen have recently become larger, it takes longer for the liquid crystal composition to cover the front side of the substrates during vacuum injection.

A new method has been suggested to sharply decrease the time needed for printing a seal material and dripping a liquid crystal for over-coating but this method has a problem of sharply deteriorated arrangement accuracy.

A method for forming a color filter on the operating TFT array substrate of a TFT color liquid crystal display (LCD) has also been suggested. Since this method does not need a color filter substrate and fabricates a transparent substrate through sputtering and binding two substrates, it has an advantage of simplifying the arrangement and increasing aspect rate.

However, when a color filter is formed on a TFT array substrate, a pixel electrode is formed on the color filter in a photolithography method by using a common positive photoresist. Accordingly, the resist layer needs to be removed after forming the electrode. In other words, a pixel electrode is formed by forming a transparent electrode layer on color pixels of a color filter, coating a positive resist composition thereon, and patterning it, exposing it to light, and developing it. Then, the resist layer remaining on the pixel electrode should be peeled and removed with a resist stripper. Accordingly, the positive resist composition requires resistance against the resist stripper. Conventional photosensitive resin compositions for a color filter, however, typically have poor stripper-resistance.

Conventionally, a pixel electrode is fabricated by forming a transparent layer (a pixel protective layer) having stripper-resistance on a color filter. In addition, a pixel electrode can be fabricated without coating a pixel protective layer by treating a stripper at a low temperature for a longer time to decrease the stripper's influence on a color filter. However, these conventional methods have problems of deteriorating a yield rate and production efficiency, since they require more processes and longer times.

In order to solve these problems, a radiation-sensitive composition with an expansion rate of less than 5% against a stripper to remove a cured layer forming a color layer in a COA method can be used. Further, a color filter can have improved thermal polymerization cross-linking effects by using a multi-functional alicyclic epoxy compound as a thermal polymerization cross-linking agent and a benzophenone-based peroxide as a photo-thermal polymerization initiator.

According to this method, a color filter can be cured at a low temperature for a short time and thereby can have excellent durability and close contacting (adhesion) properties. However, as the demand for larger screens with higher image quality than can be produced using conventional methods increases, there is also an increased need for color filters with a higher aperture ratio and higher performance.

SUMMARY OF THE INVENTION

One embodiment of the present invention provides a photosensitive resin composition for a color filter that can have excellent heat resistance and chemical resistance.

Another embodiment of the present invention provides a color filter using the photosensitive resin composition for a color filter.

According to one embodiment of the present invention, a photosensitive resin composition for a color filter is provided that includes (A) an acrylic-based copolymer including a structural unit represented by the following Chemical Formula 1 and another structural unit represented by the following Chemical Formula 2; (B) an acrylic-based photopolymerizable monomer; (C) a photopolymerization initiator; (D) a pigment; and (E) a solvent.

[Chemical Formula 1]

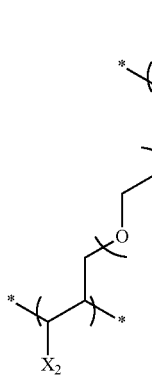

In Chemical Formula 1,
$X_1$ is H or C1 to C20 alkyl,
$X_2$ is substituted or unsubstituted C1 to C20 alkyl, C5 to C20 aryl, C7 to C20 alkylaryl, C3 to C20 cycloalkyl, or C5 to C20 multicycloalkyl, and
p is an integer ranging from 0 to 20.

[Chemical Formula 2]

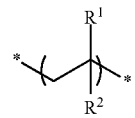

In Chemical Formula 2,
$R^1$ is hydrogen or C1 to C10 alkyl, and
$R^2$ is carboxyl, substituted or unsubstituted C1 to C20 alkyl, or COR'COOH, wherein R' is substituted or unsubstituted C1 to C20 alkylene or substituted or unsubstituted C1 to C20 alkoxylene.

The acrylic-based copolymer (A) may include the structural unit represented by the above Chemical Formula 1 in an amount of about 0.05 to about 70 wt % and the structural unit represented by the above Chemical Formula 2 in an amount of about 5 wt % to about 40 wt %, based on the total weight of the acrylic-based copolymer (A).

The photosensitive resin composition for a color filter may include about 1 to about 60 wt % of the acrylic-based copolymer including the structural unit represented by the above Chemical Formula 1 and the structural unit represented by the Chemical Formula 2 (A); about 0.5 to about 20 wt % of the acrylic-based photopolymerizable monomer (B); about 0.1 to about 10 wt % of the photopolymerization initiator (C); about 0.1 to about 40 wt % of the pigment (D); and balance of the solvent (E).

The acrylic-based copolymer (A) may have a weight average molecular weight (Mw) of about 3,000 to about 150,000.

The acrylic-based copolymer (A) may have an acid value of about 20 to about 180 mgKOH/g.

The acrylic-based copolymer (A) may further include at least one of the structural units represented by Chemical Formulae 2-1 to 2-5, or a combination thereof.

[Chemical Formula 2-1]

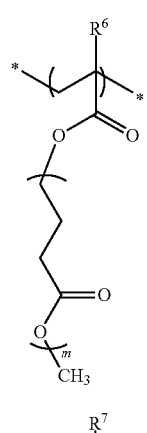

[Chemical Formula 2-2]

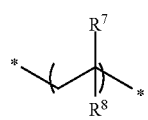

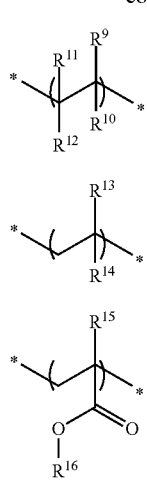

[Chemical Formula 2-3]

[Chemical Formula 2-4]

[Chemical Formula 2-5]

In Chemical Formulae 2-1 to 2-5, $R^6$, $R^7$, $R^9$, $R^{11}$, $R^{13}$ and $R^{15}$ are the same or different and are independently hydrogen or C1 to C10 alkyl, $R^5$ is hydrogen, halogen, or hydroxyl, $R^{10}$ is carboxyl or CONHR", wherein R" is substituted or unsubstituted C1 to C20 alkyl or substituted or unsubstituted C6 to C30 aryl, $R^{12}$ is carboxyl, and optionally $R^{10}$ and $R^{12}$ are fused to each other to form a fused ring, $R^{14}$ is substituted or unsubstituted C6 to C30 aryl, $R^{16}$ is substituted or unsubstituted C1 to C20 alkyl or substituted or unsubstituted C6 to C30 aryl, and m is an integer ranging from 1 to 5.

The acrylic-based copolymer (A) may include at least one of the structural units represented by the above Chemical Formulae 2-1 to 2-5, or a combination thereof, in an amount ranging from about 5 to about 80 wt %, based on the total weight of the acrylic-based copolymer (A).

The photosensitive resin composition may further include one or more additives such as but not limited to a dispersing agent; malonic acid; 3-amino-1,2-propanediol; a vinyl- or (meth)acryloxy-containing silane-based coupling agent; a leveling agent; a fluorine-based surfactant; a radical polymerization initiator, or a mixture thereof.

According to another embodiment of the present invention, a color filter manufactured using the photosensitive resin composition for a color filter is provided.

Hereinafter, embodiments of the present invention will be described in detail.

The photosensitive resin composition for a color filter according to the present invention can have excellent heat resistance and chemical resistance and thus can form excellent hole and pattern characteristics. Accordingly, the photosensitive resin composition of the present invention can be used to fabricate a color filter on a TFT array substrate to provide a high aperture ratio and a high contrast ratio.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "alkyl" may refer to C1 to C20 alkyl, the term "aryl" may refer to C6 to C30 aryl, the term "arylalkyl" may refer to C7 to C30 arylalkyl, the term "alkylene" may refer to C1 to C20 alkylene, and the term "alkoxylene" may refer to C1 to C20 alkoxylene.

As used herein, when a specific definition is not otherwise provided, the term "substituted" may refer to one substituted with a substituent comprising halogen (F, Cl, Br, or I), hydroxyl, nitro, cyano, imino (=NH, =NR, wherein R is C1 to C10 alkyl), amino (—NH$_2$, —NH(R'), —N(R") (R'"), wherein R' to R'" are independently C1 to C10 alkyl), amidino, hydrazine, hydrazone, carboxyl, substituted or unsubstituted C1 to C20 alkyl, substituted or unsubstituted C6 to C30 aryl, substituted or unsubstituted C3 to C30 cycloalkyl, substituted or unsubstituted C3 to C30 heteroaryl, substituted or unsubstituted C2 to C30 heterocycloalkyl, or a combination thereof, in place of at least one hydrogen in a functional group.

As used herein, when a specific definition is not otherwise provided, the term "hetero" may refer to a cyclic group in which one or more hydrogen atoms is substituted with one or more heteroatoms including N, O, S, P, or a combination thereof.

The photosensitive resin composition for a color filter according to one embodiment of the present invention includes (A) an acrylic-based copolymer including a structural unit represented by the following Chemical Formula 1 and another structural unit represented by the following Chemical Formula 2; (B) an acrylic-based photopolymerizable monomer; (C) a photopolymerization initiator; (D) a pigment; and (E) a solvent.

[Chemical Formula 1]

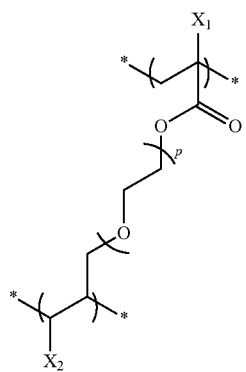

In Chemical Formula 1, $X_1$ is H or C1 to C20 alkyl, $X_2$ is substituted or unsubstituted C1 to C20 alkyl, C5 to C20 aryl, C7 to C20 alkylaryl, C3 to C20 cycloalkyl, or C5 to C20 multicycloalkyl, and p is an integer ranging from 0 to 20.

[Chemical Formula 2]

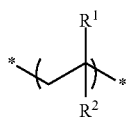

In Chemical Formula 2, $R^1$ is hydrogen or C1 to C10 alkyl, and $R^2$ is carboxyl, substituted or unsubstituted C1 to C20 alkyl, or COR'COOH, wherein R' is substituted or unsubstituted C1 to C20 alkylene or substituted or unsubstituted C1 to C20 alkoxylene.

One or more other additives (F) may be further included.

Since the photosensitive resin composition for a color filter can have excellent heat resistance and chemical resistance and thus can form excellent hole and pattern characteristics as well as provide high luminance and high contrast ratio, it can be used to fabricate a color filter formed on a TFT array substrate.

Hereinafter, the components of the photosensitive resin composition for a color filter are illustrated in detail.

(A) Acrylic-Based Copolymer

The acrylic-based copolymer includes a structural unit represented by the following Chemical Formulae 1 and 2.

[Chemical Formula 1]

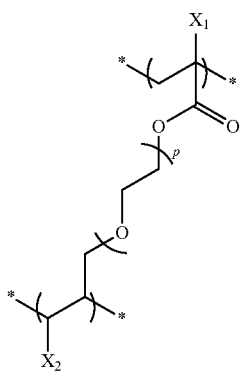

In Chemical Formula 1, $X_1$ is H or C1 to C20 alkyl, $X_2$ is substituted or unsubstituted C1 to C20 alkyl, C5 to C20 aryl, C7 to C20 alkylaryl, C3 to C20 cycloalkyl, or C5 to C20 multicycloalkyl, and p is an integer ranging from 0 to 20.

The term 'multicycloalkyl' means cycloalkyl having plural rings that are fused.

The structural unit represented by the above Chemical Formula 1 has two polymerization chains.

The acrylic-based copolymer (A) may include the structural unit represented by Chemical Formula 1 in an amount of about 0.05 to about 70 wt %, for example about 0.1 to about 50 wt %, based on the total weight of the copolymer. In some embodiments, the acrylic-based copolymer (A) may include the structural unit represented by Chemical Formula 1 in an amount of about 0.05, 0.06, 0.07, 0.08, 0.09, 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, or 70 wt %. Further, according to some embodiments of the present invention, the amount of the structural unit represented by Chemical Formula 1 can be in a range from about any of the foregoing amounts to about any other of the foregoing amounts.

When the structural unit represented by the above Chemical Formula 1 is included in an amount within the above range, the composition may have excellent pattern property.

[Chemical Formula 2]

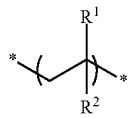

In Chemical Formula 2, $R^1$ is hydrogen or C1 to C10 alkyl, and $R^2$ is carboxyl, substituted or unsubstituted C1 to C20 alkyl, or COR'COOH, wherein R' is substituted or unsubstituted C1 to C20 alkylene or substituted or unsubstituted C1 to C20 alkoxylene.

The acrylic-based copolymer (A) may include the structural unit represented by Chemical Formula 2 in an amount of about 5 to about 40 wt %, based on the total weight of the acrylic-based copolymer (A). In some embodiments, the acrylic-based copolymer (A) may include the structural unit represented by Chemical Formula 2 in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the structural unit represented by Chemical Formula 2 can be in a range from about any of the foregoing amounts to about any other of the foregoing amounts.

When the structural unit represented by the above Chemical Formula 2 is included in an amount within the above range, the composition may have excellent developing property.

The acrylic-based copolymer may further include at least one of the structural units represented by the following Chemical Formulae 2-1 to 2-5, or a combination thereof.

[Chemical Formula 2-1]

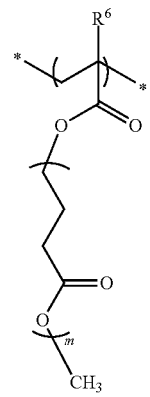

[Chemical Formula 2-2]

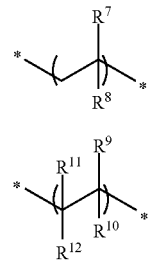

[Chemical Formula 2-3]

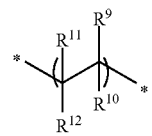

[Chemical Formula 2-4]

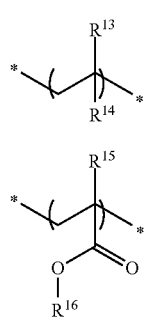

[Chemical Formula 2-5]

In Chemical Formulae 2-1 to 2-5, $R^6$, $R^7$, $R^9$, $R^{11}$, $R^{13}$ and $R^{15}$ are the same or different and are independently hydrogen or C1 to C10 alkyl, $R^8$ is hydrogen, halogen, or hydroxyl, $R^{10}$ is carboxyl or CONHR", wherein R" is substituted or unsubstituted C1 to C20 alkyl or substituted or unsubstituted C6 to C30 aryl, $R^{12}$ is carboxyl, and optionally $R^{10}$ and $R^{12}$ are fused to each other to form a fused ring, $R^{14}$ is substituted or unsubstituted C6 to C30 aryl, $R^{16}$ is substituted or unsubstituted C1 to C20 alkyl or substituted or unsubstituted C6 to C30 aryl, and m is an integer ranging from 1 to 5.

At least one of the structural units represented by the above Chemical Formulae 2-1 to 2-5 has a similar structure to a photoreactive functional group included in a photopolymerization monomer, which is described in more detail below, and thus, may crosslink acrylic-based copolymers (A) with radicals introduced by a photopolymerization initiator by the photopolymerization reaction.

The cross-linking of at least one of the structural units represented by the above Chemical Formulae 2-1 to 2-5 may be controlled by a ratio between the photopolymerization monomer described below and a photopolymerization initiator.

When the acrylic-based copolymer includes at least one structural unit represented by the above Chemical Formulae 2-1 to 2-5, it may provide fine pattern properties and excellent heat and chemical resistance, which are important in a color filter fabricated in a COA method and the like.

When the acrylic-based copolymer includes at least one structural unit represented by the above Chemical Formulae 2-1 to 2-5, the structural unit may be included in an amount ranging from about 5 to about 80 wt %, for example about 10 to about 70 wt %, based on the total weight of the acrylic-based copolymer (A). In some embodiments, the acrylic-based copolymer (A) may include the structural unit represented by Chemical Formulae 2-1 to 2-5 in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80 wt %. Further, according to some embodiments of the present invention, the amount of the structural unit represented by Chemical Formulae 2-1 to 2-5 can be in a range from about any of the foregoing amounts to about any other of the foregoing amounts.

When the structural unit represented by Chemical Formulae 2-1 to 2-5 is included in an amount within the above range, the composition may exhibit excellent chemical resistance and excellent pattern stability with minimal or no deterioration of transmission characteristics against a light.

When the acrylic-based binder resin includes all the structural units represented by the above Chemical Formulae 2-1 to 2-5, each structural unit is included in an amount of $n^1$, $n^2$, $n^3$, $n^4$, and $n^5$ mol, wherein $0 \leq n^1 \leq 50$, $0 \leq n^2 \leq 50$, $0 \leq n^3 \leq 50$, $0 \leq n^4 \leq 50$, and $1 \leq n^5 \leq 50$, for example $1 \leq n^1 \leq 40$, $1 \leq n^2 \leq 40$, $1 \leq n^3 \leq 40$, $1 \leq n^4 \leq 40$, $3 \leq n^5 \leq 40$. When the structural units represented by the above Chemical Formulae 2-1 to 2-5 are included in an amount within the above ratio range, the composition may exhibit appropriate developing properties, heat resistance, and chemical resistance.

The acrylic-based copolymer may have a weight average molecular weight ranging from about 3,000 to about 150,000 g/mol, for example from about 5,000 to about 50,000 g/mol. When the acrylic-based copolymer has a weight average molecular weight in an amount within the above range, the photosensitive resin composition may have excellent developing property.

The acrylic-based copolymer may have an acid value ranging from about 20 to about 180 mgKOH/g, for example from about 50 to about 140 mgKOH/g. When the acrylic-based copolymer has an acid value within the above range, the photosensitive resin composition may have excellent developing property.

The acrylic-based copolymer (A) can be produced by reacting suitable starting materials to provide a compound with structural units represented by the foregoing Chemical Formulae 1 and 2. Suitable starting materials are commercially available and/or can be readily synthesized by the skilled artisan. The examples below illustrate non-limiting exemplary starting materials and reaction conditions suitable for making the acrylic-based copolymer (A). The skilled artisan will understand and appreciate how to make the acrylic-based copolymer (A), including the selection of suitable starting materials and reaction conditions, without undue experimentation.

The photosensitive resin composition may include the acrylic-based copolymer in an amount ranging from about 1 to about 60 wt %, for example from about 3 to about 30 wt %, based on the total weight of the photosensitive resin composition. In some embodiments, the photosensitive resin composition may include the acrylic-based copolymer in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60 wt %. Further, according to some embodiments of the present invention, the amount of the acrylic-based copolymer can be in a range from about any of the foregoing amounts to about any other of the foregoing amounts.

When the acrylic-based copolymer is included in an amount within the above range, the composition may have excellent developing property in an alkali developing solution, decreased surface roughness due to good cross-linking, and excellent chemical resistance and thus, no stripped pattern.

(B) Acrylic-Based Photopolymerizable Monomer

Examples of the acrylic-based photopolymerizable monomer may include without limitation ethylene glycol diacrylate, triethylene glycol diacrylate, 1,4-butanediol diacrylate, 1,6-hexanediol diacrylate, neopentyl glycol diacrylate, pentaerythritol diacrylate, pentaerythritol triacrylate, dipentaerythritol diacrylate, dipentaerythritol triacrylate, dipentaerythritol pentaacrylate, pentaerythritol hexaacrylate, bisphenolA diacrylate, trimethylolpropane triacrylate, novolacepoxy acrylate, ethyleneglycol dimethacrylate, diethyleneglycol dimethacrylate, triethyleneglycol dimethacrylate, propylene glycol dimethacrylate, 1,4-butanediol dimethacrylate, 1,6-hexanediol dimethacrylate, and the like, and combinations thereof.

The photosensitive resin composition may include the acrylic-based photopolymerizable monomer in an amount of about 0.5 to about 20 wt %, based on the total weight of the photosensitive resin composition. In some embodiments, the photosensitive resin composition may include the acrylic-based photopolymerizable monomer in an amount of about 0.5, 0.6, 0.7, 0.8, 0.9, 1, 2, 3, 4, 5, 6, 7, 8, 9, 10, 11, 12, 13, 14, 15, 16, 17, 18, 19, or 20 wt %. Further, according to some embodiments of the present invention, the amount of the acrylic-based photopolymerizable monomer can be in a range from about any of the foregoing amounts to about any other of the foregoing amounts.

When the acrylic-based photopolymerizable monomer is included in an amount within the above range, a pattern may have a neat edge and good developing property in an alkali developing solution.

(C) Photopolymerization Initiator

Examples of the photopolymerization initiator may include without limitation triazine-based compounds, acetophenone-based compounds, benzophenone-based compounds, thioxanthone-based compounds, benzoin-based compounds, oxime-based compounds, and the like, and combinations thereof.

Examples of the triazine-based compound may include without limitation 2,4,6-trichloro-s-triazine, 2-phenyl-4,6-bis(trichloromethyl)-s-triazine, 2-(3',4'-dimethoxy styryl)-4,6-bis(trichloromethyl)-s-triazine, 2-(4'-methoxy naphthyl)-4,6-bis(trichloromethyl)-s-triazine, 2-(p-methoxy phenyl)-4,6-bis(trichloromethyl)-s-triazine, 2-(p-tolyl)-4,6-bis (trichloro methyl)-s-triazine, 2-biphenyl-4,6-bis(trichloro methyl)-s-triazine, bis(trichloro methyl)-6-styryl-s-triazine, 2-(naphto-1-yl)-4,6-bis(trichloro methyl)-s-triazine, 2-(4-methoxy naphto-1-yl)-4,6-bis(trichloro methyl)-s-triazine, 2,4-bis(trichloro methyl))-6-piperonyl-s-triazine, 2,4-bis (trichloro methyl)-(4'-methoxy styryl)-s-triazine, and the like, and combinations thereof.

Examples of the acetophenone-based compound may include without limitation 2,2'-diethoxy acetophenone, 2,2'-dibutoxy acetophenone, 2-hydroxy-2-methyl propinophenone, p-t-butyl trichloro acetophenone, p-t-butyl dichloro acetophenone, 4-chloro acetophenone, 2,2'-dichloro-4-phenoxy acetophenone, 2-methyl-1-(4-(methylthio)phenyl)-2-morpholino propan-1-one, 2-benzyl-2-dimethyl amino-1-(4-morpholino phenyl)-butan-1-one, and the like, and combinations thereof.

Examples of the benzophenone-based compound may include without limitation benzophenone, benzoyl benzoic acid, benzoyl benzoic acid methyl ester, 4-phenyl benzophenone, hydroxy benzophenone, acrylated benzophenone, 4,4'-bis(dimethyl amino)benzophenone, 4,4'-dichloro benzophenone, 3,3'-dimethyl-2-methoxy benzophenone, and the like, and combinations thereof.

Examples of the thioxanthone-based compound may include without limitation thioxanthone, 2-methyl thioxanthone, isopropyl thioxanthone, 2,4-diethyl thioxanthone, 2,4-diisopropyl thioxanthone, 2-chloro thioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyl dimethyl ketal, and the like, and combinations thereof.

Examples of the oxime-based compound may include without limitation 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, and the like, and combinations thereof.

The photopolymerization initiator may further include a carbazole-based compound, a diketone-based compound, a sulfonium borate-based compound, a diazo-based compound, a biimidazole-based compound, and the like, and combinations thereof.

The photosensitive resin composition may include the photopolymerization initiator in an amount of about 0.1 to about 10 wt %, based on the total weight of the photosensitive resin composition for a color filter. In some embodiments, the photosensitive resin composition may include the photopolymerization initiator in an amount of about 0.1, 0.2, 0.3, 0.4, 0.5, 0.6, 0.7, 0.8, 0.9, 1, 2, 3, 4, 5, 6, 7, 8, 9, or 10 wt %. Further, according to some embodiments of the present invention, the amount of the photopolymerization initiator can be in a range from about any of the foregoing amounts to about any other of the foregoing amounts. When the photopolymerization initiator is included in an amount within the above range, the composition may be sufficiently photopolymerized when exposed during the pattern-forming process and may exhibit minimal or no transmittance deterioration due to non-reacted initiator remaining after the photopolymerization.

(D) Pigment

The pigment can include red, green, blue, yellow, and violet colors. Examples of the pigment may include without limitation anthraquinone-based pigments, condensed polycyclic pigments such as perylene-based pigments and the like, phthalocyanine pigments, azo-based pigments, and the like. The pigments may be used singularly or in combination of two or more. The combination of two or more pigments can be useful to adjust maximum absorption wavelength, cross point, crosstalk, and the like.

The pigment may be included in a photosensitive resin composition for a color filter as a pigment dispersion solution.

In addition, the pigment may include a dispersing agent, so that the pigment component can be uniformly dispersed. Examples of the dispersing agent include without limitation nonionic, anionic, and cationic dispersing agents, for example, polyalkylene glycol and esters thereof, polyoxyalkylene, polyhydric alcohol ester alkylene oxide additives, alcoholalkyleneoxide additives, sulfonic acid esters, sulfonic acid salts, carboxylic acidesters, carboxylic acid salts, alkylamidealkyleneoxide additives, alkylamines, and the like. These dispersing agents can be used singular or as a combination of two or more.

In addition, a carboxyl-containing acrylic-based resin as well as the dispersing agent can be added to the pigment in order to improve pixel pattern as well as stability of the pigment dispersion solution.

The pigment can have a primary particle diameter ranging from about 10 to about 80 nm, for example ranging from about 10 to about 70 nm. When the pigment has a primary particle diameter within the above range, it can have excellent stability in a dispersion solution but may not deteriorate resolution of pixels.

The photosensitive resin composition may include the pigment in an amount of about 0.1 to about 40 wt %, based on the total weight of the photosensitive resin composition. In some embodiments, the photosensitive resin composition may include the pigment in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40 wt %. Further, according to some embodiments of the present invention, the amount of the pigment can be in a range from about any of the foregoing amounts to about any other of the foregoing amounts. When the pigment is included in an amount within the above range, the composition may have appropriate coloring effects and developing performance.

(E) Solvent

Examples of the solvent may include without limitation ethylene glycol acetate, ethyl cellosolve, ethyl ethoxy propionate, ethyl lactate, polyethyleneglycol, and the like, and combinations thereof. The solvent may also include ethylene glycol-based compounds such as ethylene glycol, diethylene glycol, and the like; glycol ether-based compounds such as ethylene glycol monomethylether, diethylene glycol monomethylether, ethylene glycol diethylether, diethylene glycol dimethylether, and the like; glycol ether acetate-based compounds such as ethylene glycol monoethylether acetate, diethylene glycol monoethylether acetate, diethylene glycol monobutylether acetate, and the like; propylene glycols such as propylene glycol and the like; propylene glycol ether-based compounds such as propylene glycol monomethylether, propylene glycol monoethylether, propylene glycol monopropylether, propylene glycol monobutylether, propylene glycol dimethylether, dipropylene glycol dimethylether, propylene glycol diethylether, dipropylene glycol diethylether, and the like; propylene glycol ether acetate-based compounds such as propylene glycol monomethylether acetate, dipropylene glycol monoethylether acetate, and the like; amide-based compounds such as N-methyl pyrrolidone, dimethyl formamide, dimethyl acetamide, and the like; ketone-based compounds such as methyl ethyl ketone (MEK), methyl isobutyl ketone (MIBK), cyclohexanone, and the like; petroleum-based compounds such as toluene, xylene, solvent naphtha, and the like; and ester-based compounds such as acetic acid ethyl ester, acetic acid butyl ester, lactic acid ethyl ester, and the like. These compounds may be used in singularly or as a mixture of two or more solvents.

The solvent may be used as in a balance amount. In exemplary embodiments, the photosensitive resin composition can include the solvent in an amount of about 20 to about 90 wt %, based on the total weight of the photosensitive resin composition. In some embodiments, the photosensitive resin composition for a color filter may include the solvent in an amount of about 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, or 90 wt %. Further, according to some embodiments of the present invention, the amount of the solvent can be in a range from about any of the foregoing amounts to about any other of the foregoing amounts. When the solvent is used within in an amount the above range, the photosensitive resin composition may have excellent coating properties and may maintain flatness when the composition is coated as a 1 μm-thick or thicker film.

(F) Other Additive(s)

The photosensitive resin composition for a color filter according to the present invention may further include a dispersing agent as described above other than the (A) to (F) components, so that a pigment (D) may be uniformly dispersed in a solvent (E).

In addition, the photosensitive resin composition may include one or more other additives such as but not, limited to malonic acid; 3-amino-1,2-propanediol; a silane-based coupling agent having a vinyl group or (meth)acryloxyl group; a leveling agent; a fluorine-based surfactant; a radical polymerization initiator, and the like, and combinations thereof to prevent a spot or a stain during the coating and a residue due to leveling characteristic or non-development. The amount of these additives may be readily determined by the skilled artisan without undue experimentation, and the amounts may vary depending on the desired composition properties.

According to one embodiment of the present invention, a photosensitive resin composition for a color filter may be coated to a thickness of about 3.1 to about 3.4 um on a bare glass substrate or a glass substrate coated with an about 500 to about 1500 Å-thick SiNx layer (a protective layer) using an appropriate method such as but not limited to spin coating, slit coating, and the like. The coated substrate can be exposed to radiation (irradiated by a light) to form a pattern required for a color filter. After the radiation, the coated layer can be treated with an alkali developing solution to dissolve the unexposed part (unradiated part) and form a pattern for a color filter. These processes can be repeated as many times as necessary depending on the number of R, G, and B colors required to form a color filter with a desired pattern. In addition, this image pattern may be cured by heating or exposing (irradiating) with an active ray to further improve crack resistance, solvent resistance, and the like.

In general, since a negative photosensitive resin is not easily stripped by an organic solvent, its residue may contaminate a lower layer. In addition, since the negative photosensitive resin is more weakly adhered to a lower layer than a positive photosensitive resin, it may have a larger under-cut. However, a photosensitive resin composition for a color filter according to the present invention may improve resistance of the negative photosensitive resin against a stripper and thus can prevent contamination of a lower layer and also improve adherence to the lower layer.

Hereinafter, Examples and Comparative Examples are illustrated to explain the present invention in more detail. However, the following exemplary embodiments should be understood not to limit but explain the present invention.

EXAMPLES

Synthesis Examples 1 to 10

Synthesis of a Copolymer Including a Structural Unit Represented by Chemical Formulae 2-1 to 2-5

2,2'-azobis(2,4-dimethylvalero nitrile) as an initiator is added in an amount sufficient to provide 10 wt % of the total monomers in a flask with a cooler and an agitator, and the monomers in Table 1 are added thereto in the amounts (wt %) indicated in Table 1. Then, 200 parts by weight of propylene glycol monomethyl ether acetate (PGMEA) as a solvent is added to 100 parts by weight of the initiator and the monomers. The mixture is slowly agitated under nitrogen atmosphere. The reactant is heated to 75° C. and agitated for 8 hours to polymerize an acrylic-based binder resin including aliphatic hydrocarbon. The acrylic-based binder resin solution has a solid concentration of 30 wt %. The weight average molecular weight is reported in Table 1 and is a polystyrene-reduced average molecular weight measured by using GPC (Gel Permeation Chromatography).

TABLE 1

|  | Synthesis Example 1 | Synthesis Example 2 | Synthesis Example 3 | Synthesis Example 4 | Synthesis Example 5 | Synthesis Example 6 | Synthesis Example 7 | Synthesis Example 8 | Synthesis Example 9 | Synthesis Example 10 |
|---|---|---|---|---|---|---|---|---|---|---|
| Methacrylic acid | 15 | 15 | 20 | 20 | 20 | 15 | 15 | 15 | 20 | 20 |
| N-phenyl maleimide |  | 15 | 15 | 12.5 |  |  | 10 |  |  | 30 |
| Styrene |  |  | 15 | 5 | 12.5 |  |  | 10 | 25 |  |
| Benzyl methacrylate | 85 | 35 | 60 | 35 | 80 | 70 | 30 |  | 30 |  |
| Polyvalerolactone methacrylate |  | 10 |  | 10 |  |  | 10 |  |  |  |
| Glycolmethacrylate |  | 10 |  | 10 |  |  |  | 10 | 10 |  |
| Cinnamyl methacrylate |  |  |  |  |  | 15 | 15 | 50 | 50 | 50 |
| Weight average molecular weight (Mw) of synthesized copolymer | 14500 | 13500 | 14000 | 12500 | 14000 | 14500 | 14200 | 15000 | 15100 | 15500 |

Preparation of a Photosensitive Resin Composition for a Color Filter

Examples 1 to 5

A photosensitive resin composition is prepared using the following components provided in Table 2. First, a photopolymerization initiator is dissolved in a solvent. The solution is agitated at room temperature for 2 hours. Then, each acrylic-based copolymer polymerized according to Synthesis Examples 6 to 10 and an acrylic-based photopolymerizable monomer are added to the resulting product. The mixture is agitated at room temperature for 2 hours. Next, a pigment dispersion solution is added thereto. The resulting mixture is agitated again at room temperature for one hour, preparing a photosensitive resin composition for a color filter. The solution is filtrated three times to remove impurities.

TABLE 2

| Composition | Amount [g] |
|---|---|
| (A) Acrylic copolymer (copolymers polymerized according to Synthesis Examples 6 to 10) | 8.0 |
| (B) Acrylic-based photopolymerizable monomer dipentaerythritol hexaacrylate (DPHA) | 6.9 |
| (C) Photopolymerization initiator IGACURE OXE02 (Ciba Specialty Chemicals Co.) | 0.2 |
| (D) Pigment dispersion solution | 46.8 |
| BT-CF (red pigment, Ciba Specialty Chemicals Co.) | 6.2 |
| 2RP-CF (yellow pigment, Ciba Specialty Chemicals Co.) | 2.8 |
| BYK21208 (a dispersing agent, BYK Ltd.) | 2.4 |
| Acrylic-based binder resin of the (A) | 5.4 |
| PGMEA (solvent) | 30.0 |
| (E) Solvent |  |
| PGMEA | 24.0 |
| Ethylethoxy propionate | 14.0 |
| (F) additive |  |
| F-475 (fluorine-based surfactant, DIC Co.) | 0.1 |

Comparative Examples 1 to 5

A photosensitive resin composition for a color filter is prepared according to the same method as Examples 1 to 5 except that (A) an acrylic copolymer according to Synthesis Examples 1 to 5 is used.

Stripper Resistance Evaluation

The stripper resistance of the photosensitive resin compositions according to Examples 1 to 5 and Comparative Examples 1 to 5 is evaluated as follows.

The photosensitive resin compositions according to Examples 1 to 5 and Comparative Examples 1 to 5 respectively are coated to a thickness of 3 μm on a transparent circular bare glass substrate and a glass substrate coated with a 500 Å thick silicon nitride (SiNx) layer using a spin-coater (K-Spin8, KDNS Co., Ltd.). The coated composition is soft-baked at 80° C. for 150 seconds using a hot-plate, exposed to a light with power output of 60 mJ using an exposer (I10C, Nikon Inc.), developed at 25° C. for 60 seconds using a developer, and then washed for 60 seconds and spin-dried for 25 seconds. A potassium hydroxide aqueous solution with a concentration of 1 wt % is used as a developing solution. Then, the developed product is hard-baked in a 230° C. oven for 30 minutes, dipped in a 70° C. stripping solution (PRS-2000, J. T. Baker Inc.) for 10 minutes, and washed and dried with deionized water (DIW).

The photosensitive resin composition film prepared according to the method is examined with an optical microscope. The results are provided in the following Table 3.

Stripping State

No stripping of a photosensitive resin composition film: excellent

Partial stripping of a photosensitive resin composition: unsatisfactory

Largely stripping of a photosensitive resin composition: bad

Heat Resistance Evaluation

The heat resistance of the photosensitive resin compositions according to Examples 1 to 5 and Comparative Examples 1 to 5 is evaluated as follows.

The photosensitive resin compositions according to Examples 1 to 5 and Comparative Examples 1 to 5 respectively are coated to a thickness of 3 μm on a transparent circular bare glass substrate and a glass substrate coated with a 500 Å thick silicon nitride (SiNx) layer using a spin-coater (K-Spin8, KDNS Co., Ltd.). The coated substrate is soft-baked at 80° C. for 150 seconds using a hot-plate, exposed to a light with power output of 60 mJ using an exposer (I10C, Nikon Inc.), developed at 25° C. for 60 seconds, and washed for 60 seconds and spin-dried for 25 seconds. A potassium hydroxide aqueous solution with a concentration of 1 wt % is used as a developing solution. Then, the developed product is hard-baked in a 230° C. oven for 30 minutes and baked again in a 230° C. oven for 2 hours. The color change is measured using a spectrophotometer (MCPD3000, Otsuka Electronics Co., Ltd.). The results are provided in the following Table 3.

Heat Resistance

Color change (ΔE) of less than 3: excellent

Color change (ΔE) ranging from more than 3 to less than 5: unsatisfactory

Color change (ΔE) of more than 5: bad

TABLE 3

| classification | Stripping state | | Heat resistance | |
|---|---|---|---|---|
| | bare glass | SiNx | bare glass | SiNx |
| Example 1 | unsatisfactory | excellent | excellent | excellent |
| Example 2 | unsatisfactory | excellent | excellent | excellent |
| Example 3 | unsatisfactory | excellent | unsatisfactory | unsatisfactory |
| Example 4 | excellent | excellent | excellent | excellent |
| Example 5 | excellent | excellent | excellent | excellent |
| Comparative Example 1 | excellent | excellent | unsatisfactory | excellent |
| Comparative Example 2 | bad | excellent | unsatisfactory | unsatisfactory |
| Comparative Example 3 | bad | unsatisfactory | unsatisfactory | bad |
| Comparative Example 4 | unsatisfactory | unsatisfactory | unsatisfactory | bad |
| Comparative Example 5 | bad | excellent | unsatisfactory | bad |

Referring to Table 3, the photosensitive resin composition films according to Examples 1 to 5 exhibit excellent hole and line pattern characteristics, little color change, no stripping against a stripping solution, excellent heat resistance and thus have excellent pattern properties and heat resistance.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for a color filter, comprising
    (A) an acrylic-based copolymer comprising a structural unit represented by Chemical Formula 1 and a structural unit represented by Chemical Formula 2;
    (B) an acrylic-based photopolymerizable monomer;
    (C) a photopolymerization initiator;
    (D) a pigment; and
    (E) a solvent:

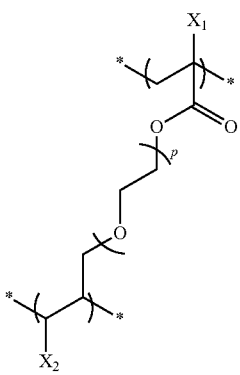

[Chemical Formula 1]

wherein, in Chemical Formula 1, $X_1$ is H or C1 to C20 alkyl, $X_2$ is substituted or unsubstituted C1 to C20 alkyl, C5 to C20 aryl, C7 to C20 alkylaryl, C3 to C20 cycloalkyl, or C5 to C20 multicycloalkyl, and p is an integer ranging from 0 to 20,

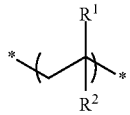

[Chemical Formula 2]

wherein, in the above Chemical Formula 2, $R^1$ is hydrogen or C1 to C10 alkyl, and $R^2$ is carboxyl, substituted or unsubstituted C1 to C20 alkyl, or COR'COOH, wherein R' is substituted or unsubstituted C1 to C20 alkylene, or substituted or unsubstituted C1 to C20 alkoxylene.

2. The photosensitive resin composition of claim 1, wherein the acrylic-based copolymer (A) comprises the structural unit represented by the above Chemical Formula 1 in an amount of about 0.05 to about 70 wt % based on the total weight of the acrylic-based copolymer (A).

3. The photosensitive resin composition of claim 1, wherein the acrylic-based copolymer (A) comprises the structural unit represented by the above Chemical Formula 2 in an amount of about 5 to about 40 wt %, based on the total weight of the acrylic-based copolymer (A).

4. The photosensitive resin composition of claim 1 comprising
    about 1 to about 60 wt % of the acrylic-based copolymer (A);
    about 0.5 to about 20 wt % of the acrylic-based photopolymerizable monomer (B);
    about 0.1 to about 10 wt % of the the photopolymerization initiator (C);
    about 0.1 to about 40 wt % of the pigment (D); and
    a balance amount of the solvent (E).

5. The photosensitive resin composition of claim 1, wherein the acrylic-based copolymer (A) comprising a structural unit represented by the above Chemical Formula 1 and a structural unit represented by Chemical Formula 2 has a weight average molecular weight (Mw) ranging from about 3,000 to about 150,000.

6. The photosensitive resin composition of claim 1, wherein the acrylic-based copolymer (A) has an acid value ranging from about 20 to about 180 mgKOH/g.

7. The photosensitive resin composition of claim 6, wherein the acrylic-based copolymer (A) further comprises at least one of the structural units represented by Chemical Formulae 2-1 to 2-5 in an amount of about 5 to about 80 wt %, based on the total weight of the acrylic-based copolymer (A).

8. The photosensitive resin composition of claim 1, wherein the acrylic-based copolymer (A) further comprises at least one structural unit represented by Chemical Formulae 2-1 to 2-5, or a combination thereof:

[Chemical Formula 2-1]

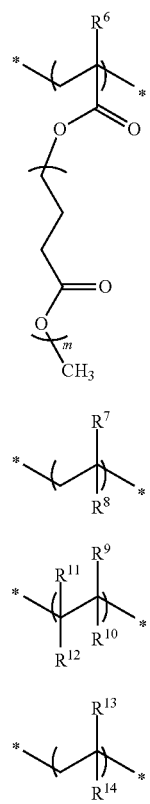

[Chemical Formula 2-2]

[Chemical Formula 2-3]

[Chemical Formula 2-4]

[Chemical Formula 2-5]

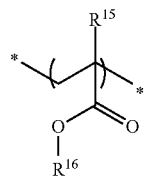

wherein, in Chemical Formulae 2-1 to 2-5, $R^6$, $R^7$, $R^9$, $R^{11}$, $R^{13}$ and $R^{15}$ are the same or different and are independently hydrogen or C1 to C10 alkyl, $R^8$ is hydrogen, halogen, or hydroxyl, $R^{10}$ is carboxyl or CONHR", wherein R" is substituted or unsubstituted C1 to C20 alkyl or substituted or unsubstituted C6 to C30 aryl, $R^{12}$ is carboxyl, and optionally $R^{10}$ and $R^{12}$ are fused to each other to form a fused ring, $R^{14}$ is substituted or unsubstituted C6 to C30 aryl, $R^{16}$ is substituted or unsubstituted C1 to C20 alkyl or substituted or unsubstituted C6 to C30 aryl, and m is an integer ranging from 1 to 5.

9. The photosensitive resin composition of claim 1, wherein the photosensitive resin composition further comprises an additive selected from the group consisting of dispersing agents; malonic acid; 3-amino-1,2-propanediol; silane-based coupling agents with a vinyl group or (meth)acryloxyl group; leveling agents; fluorine-based surfactants; radical polymerization initiators; and mixtures thereof.

10. A color filter fabricated by using a photosensitive resin composition according to claim 1.

* * * * *